United States Patent
Barabash

(10) Patent No.: US 9,294,038 B2
(45) Date of Patent: Mar. 22, 2016

(54) POWER AMPLIFIER TRANSISTOR CHARACTERISTIC STABILIZATION DURING BIAS SWITCHING

(71) Applicant: NOKIA SIEMENS NETWORKS OY, Espoo (FI)

(72) Inventor: Darrell Barabash, Grapevine, TX (US)

(73) Assignee: NOKIA SOLUTIONS AND NETWORKS OY, Espoo (FI)

(*) Notice: Subject to any disclaimer, the term of this patent is extended or adjusted under 35 U.S.C. 154(b) by 158 days.

(21) Appl. No.: 13/872,772

(22) Filed: Apr. 29, 2013

(65) Prior Publication Data

US 2014/0320210 A1    Oct. 30, 2014

(51) Int. Cl.
| | |
|---|---|
| H03F 1/14 | (2006.01) |
| H03F 1/02 | (2006.01) |
| H03F 1/30 | (2006.01) |
| H03F 3/24 | (2006.01) |
| H03F 3/72 | (2006.01) |

(52) U.S. Cl.
CPC ............ H03F 1/0205 (2013.01); H03F 1/301 (2013.01); H03F 3/245 (2013.01); H03F 3/72 (2013.01)

(58) Field of Classification Search
CPC ....... H03F 3/72; H03F 1/0277; H03F 1/0088; H03F 1/305; H03F 2200/294; H03F 1/302; H03F 2200/18; H03F 1/301; H03F 1/30; H03F 2200/447
USPC ................................... 330/51, 285, 289, 296
See application file for complete search history.

(56) References Cited

U.S. PATENT DOCUMENTS

| | | | |
|---|---|---|---|
| 6,166,591 A | 12/2000 | Schultz et al. | |
| 6,418,304 B1 | 7/2002 | Morrar | |
| 7,034,618 B2 | 4/2006 | Barabash | |
| 7,095,282 B2 | 8/2006 | Barabash | |
| 7,348,854 B1* | 3/2008 | Mordkovich | 330/298 |
| 7,876,157 B1* | 1/2011 | Kang et al. | 330/285 |
| 2005/0062528 A1* | 3/2005 | Kuriyama | 330/133 |
| 2007/0296503 A1* | 12/2007 | Nakayama et al. | 330/296 |
| 2008/0116977 A1* | 5/2008 | Jung et al. | 330/296 |
| 2009/0174474 A1* | 7/2009 | Matsuzuka et al. | 330/51 |
| 2010/0102887 A1* | 4/2010 | Takahashi et al. | 330/285 |
| 2011/0128078 A1 | 6/2011 | Doherty et al. | |

OTHER PUBLICATIONS

Extended European Search Report dated Nov. 27, 2014, issued in corresponding European Patent Application No. EP 14165732.0, 5 pages.

* cited by examiner

*Primary Examiner* — Khanh V Nguyen
(74) *Attorney, Agent, or Firm* — Squire Patton Boggs (US) LLP

(57) ABSTRACT

Communications equipment including communications equipment for wireless communications may benefit from power amplifier transistors having stabilized characteristics. For example, certain power amplifier transistors may benefit from having their characteristics stabilized during bias switching. An apparatus can include a power amplifier device. The apparatus can also include a voltage or current input to the power amplifier device. An input voltage or current to the voltage or current input can be configured to be controlled according to scheduled transmission in a slot. The apparatus can also include a gate bias insertion circuit provided at the bias input. The gate bias insertion circuit can be configured to provide a reduced input voltage or current as a power amplifier bias. The reduced input voltage or current can be configured to correspond to a threshold of a transistor of the power amplifier when transmission is not scheduled in a slot.

20 Claims, 6 Drawing Sheets

POWER AMPLIFIER TRANSISTOR CHARACTERISTIC STABILIZATION DURING BIAS SWITCHING

BACKGROUND

1. Field

Communications equipment including communications equipment for wireless communications may benefit from power amplifier transistors having stabilized characteristics. For example, certain power amplifier transistors may benefit from having their characteristics stabilized during bias switching.

2. Description of the Related Art

Although there are various techniques for attempting to reduce power amplifier energy consumption, these techniques have had limited benefit. For example, conventional approaches provide a significant performance penalty. For example, conventional approaches provide a compromise of either not switching certain stages at all and/or turning stages on in anticipation of a need. In either case, the power saving achieved is less than is possible and performance is generally degraded to minimum margin especially in the case of sporadic usage, for example during low traffic in second generation (2G) time division multiple access (TDMA) type systems such as global system for mobile communication (GSM).

SUMMARY

According to a first embodiment, a method includes determining that there is no transmission scheduled during a timeslot. The method also includes restoring power amplifier bias to nominal during an active transmission period. The method further includes reducing the power amplifier bias at the end of the active transmission period. Reducing the power amplifier bias comprises reducing the power amplifier bias to a threshold of a transistor of the power amplifier.

In certain variations, the threshold is a predetermined fixed threshold.

In certain variations, the threshold is a temperature dependent dynamic threshold.

In certain variations, the threshold is a process dependent dynamic threshold.

In certain variations, the method further includes providing a series switching device between a bias source and the transistor. The power amplifier bias is controlled by use of the series switching device.

In certain variations, the method further includes controlling an off-state voltage of the power amplifier bias based on a nominal bias condition.

In certain variations, the controlling tracks threshold variations of the transistor over temperature.

According to a second embodiment, an apparatus includes a power amplifier device. The apparatus also includes a voltage input to the power amplifier device. An input voltage to the voltage input is configured to be controlled according to scheduled transmission in a time slot or some other active transmission interval. The apparatus also includes a gate bias insertion circuit provided at the voltage input. The gate bias insertion circuit is configured to provide a reduced input voltage (or current, depending on the type of transistor) as a power amplifier bias, wherein the reduced input voltage is configured to correspond to a threshold of a transistor of the power amplifier when transmission is not scheduled in a slot or active transmission interval.

In certain variations, the gate bias insertion circuit comprises a series switching device between a bias source and the transistor, wherein the power amplifier bias is configured to be controlled by use of the series switching device.

In certain variations, the series switching device is provided with a resistive divider configured to divide a voltage across the series switching device.

In certain variations, the series switching device is provided with a diode level shifter configured to divide a voltage across the series switching device.

In certain variations, the series switching device is provided with a current source level shift configured to divide a voltage across the series switching device.

In certain variations, the series switching device is provided with quasi-independent sources, wherein the series switching device is configured to select between the quasi-independent sources.

According to a third embodiment, an apparatus includes determining means for determining that there is no transmission scheduled during a timeslot or time interval. The apparatus also includes restoring means for restoring power amplifier bias to nominal during an active transmission period. The apparatus further includes reducing means for reducing the power amplifier bias at the end of the active transmission period. Reducing the power amplifier bias comprises reducing the power amplifier bias to a threshold of a transistor of the power amplifier.

In certain variations, the threshold is a predetermined fixed threshold.

In certain variations, the threshold is a temperature dependent dynamic threshold.

In certain variations, the threshold is a process dependent dynamic threshold.

In certain variations, the apparatus further includes series switching means for controlling a power amplifier bias. The series switching means is provided between a bias source and the transistor.

In certain variations, the apparatus further includes controlling means for controlling an off-state voltage of the power amplifier bias based on a nominal bias condition.

In certain variations the controlling means is further for tracking threshold variations of the transistor over temperature.

BRIEF DESCRIPTION OF THE DRAWINGS

For proper understanding of the invention, reference should be made to the accompanying drawings, wherein.

DETAILED DESCRIPTION

Figure 1:
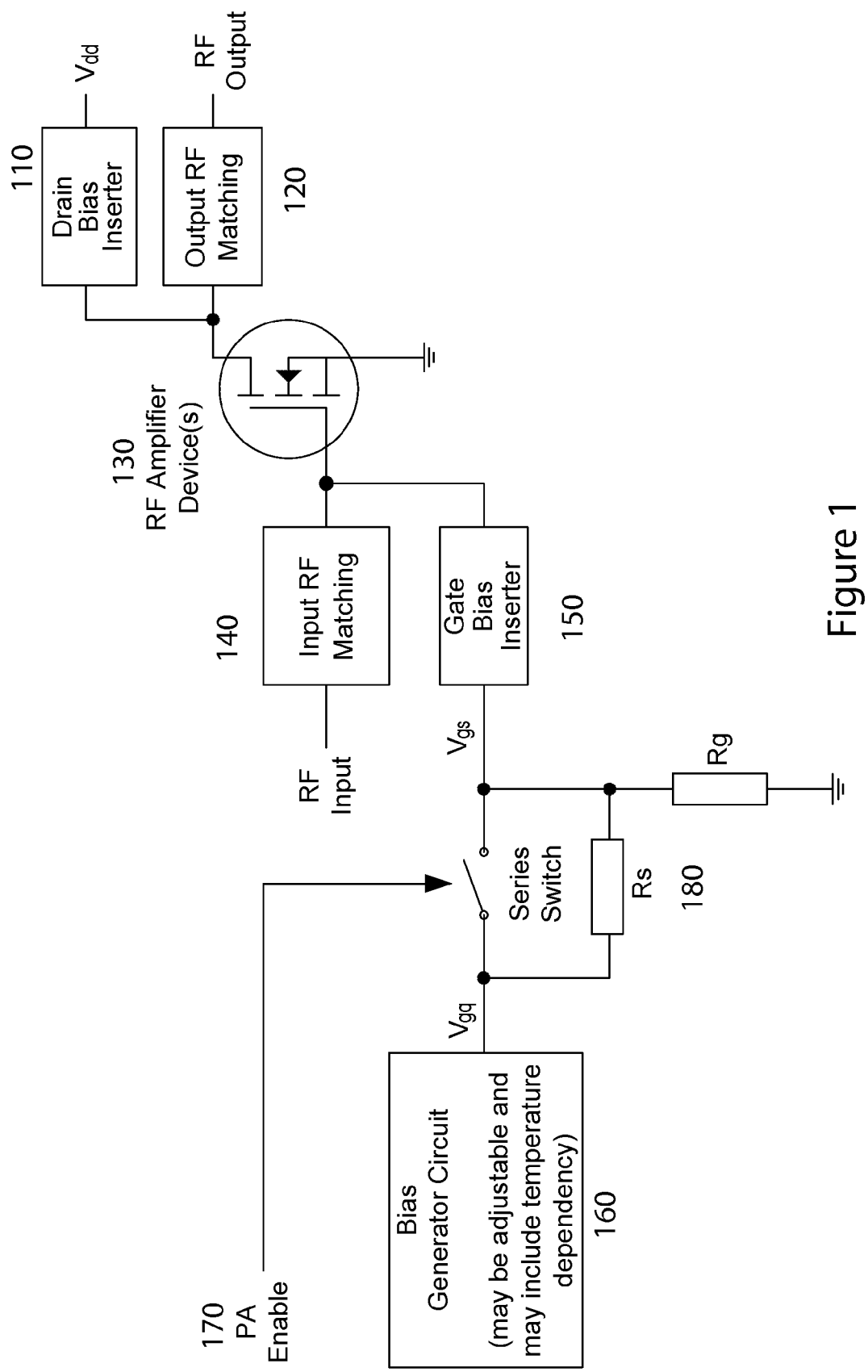
FIG. 1 illustrates an apparatus according to certain embodiments, including a resistive divider.

Cellular operators may desire to reduce power consumption for a variety of reasons, such as cost and environmental impact. During time division multiple access (TDMA) operation there may be times when there is no transmission during certain timeslots yet the linear power amplifier (LPA) is consuming energy. Global System for Mobile communication (GSM) is one example of a TDMA communication system, although certain embodiments can apply to other communication systems.

Reducing the power amplifier bias during these (low traffic) times can efficiently reduce energy consumption. A consequence of such a reduction can be that the behavior of the linear power amplifier is different when reactivated and linearization can fail. For example, transient signal distortion and spurious responses may arise, particularly when LPA linearization is being employed.

However, in certain embodiments if the bias is reduced only to the threshold, energy savings can be achieved with minimal performance degradation. Certain embodiments provide different methods and circuits to perform this bias shift in spite of device variability due to process and temperature.

Linearization techniques can be used with power amplifiers to obtain adequate distortion performance whilst maximizing efficiency, especially when the transmitter must support multiple carriers having same or differing modulations. The complexity is such that the algorithms may operate and adapt based on relatively slowly varying characteristics, where slowness is relative to the symbol rate. For example, the update rate may be in the order of 60 milliseconds, whereas symbol periods may be in the order of nanoseconds.

As a consequence of this slow adaptation, the power amplifier may be assumed to be relatively time invariant during this sort of interval. Moreover, such an assumption may be correct for high bandwidth techniques such as those associated with wideband code division multiple access (WCDMA) or long term evolution (LTE). However, this assumption may be untrue for low traffic TDMA and specifically for global system for mobile communication (GSM) type systems.

In the latter case, it may be valuable to disable the power amplifier during periods of no traffic. These periods may be as short as a time slot or as long as many frames. Regardless, after the power amplifier is turned off, the active device die may quickly cool and internal capacitances, both intrinsic and extrinsic, to the active device may discharge. For example, the cooling may involve dropping tens of degrees in several hundred microseconds. This can reduce energy consumption. However, if the device is now reactivated, the device's characteristic can be quite different from just before it was shut down. Moreover, this characteristic will rapidly change as the die heats again and the capacitances recharge. During this interval, the assumption that the power amplifier is relatively time invariant may be significantly violated. Consequently, linearization may fail during this short period.

By contrast, certain embodiments provide methods and circuits that may greatly reduce the behavioral change of the active device. Indeed, by using certain embodiments it may be possible to switch the power amplifier quickly and have virtually no discernible performance degradation. Thus, energy can be saved without performance penalty.

In summary, certain embodiments may have various characteristics. For example, the transistor may be biased from a temperature compensated reference where the reference preferentially exhibits a temperature dependent voltage that is similar to that of the radio frequency (RF) transistor. U.S. Pat. Nos. 7,095,282 and 7,034,618, for example, discuss temperature compensating circuits and are incorporated herein by reference in their entirety.

A series switching device, such as a field effect transistor (FET), can be placed between the bias source and the RF transistor gate, so that the voltage can be selectively applied. The series switch, in conjunction with its additional circuitry, can be designed such that rather than switching the bias completely off, the series switch applies a voltage to the gate that is roughly the threshold voltage. By applying a voltage roughly equal to the transistor threshold, current consumption may be minimized whilst not depleting charges stored by the active device and/or the associated matching and bias circuits. Thus, the device can be turned on quickly and the change in characteristics can be minimized.

Moreover, in certain embodiments the off-state gate bias voltage can be based on the nominal bias condition, so that the off-state gate bias voltage tracks threshold variations over temperature. Furthermore, in certain embodiments, the off-state voltage can be based on the nominal bias condition, and can therefore intrinsically account for device-to-device variations. Thus, certain embodiments may be incorporated into a manufactured device.

As a practical matter, the threshold voltage or current can be variable due to process and temperature effects. Therefore, in certain embodiments, the off state bias can be derived from the on state bias, rather than using a completely independent bias source. This mechanism can provide a degree of insensitivity to device variations be it process, circuit or environment induced.

Various possible implementations are described herein using laterally diffused metal oxide semiconductor field effect transistor (LDMOS) technology. This is just an example of a prevalent technology. However, certain embodiments are equally applicable to any RF semiconductor including but not limited to metal oxide semiconductor field effect transistors (MOSFETs), bipolar junction transistors (BJTs), hetero junction bipolar transistors (HBTs), metal semiconductor field effect transistors (MESFETs).

In FIGS. 1-4 it is assumed that the bias generator voltage is set to obtain some desired quiescent drain current. Note that due to the variability of the threshold voltage of FET's, the voltage may need to be aligned in production for each device. However, even though the absolute voltage may vary, the voltage differential to pinch-off may generally be constant. The voltage difference being relatively constant may be true for device to device variation and also for temperature. Therefore, by designing the series switch so that the voltage difference between on-state and off-state is constant, regardless of the absolute voltages, certain embodiments can be independent of threshold voltage shifts. Such an ability to accommodate device to device variations can benefit the design, implementation and manufacturability of power amplifier circuits employing these techniques and circuits.

Figure 2:
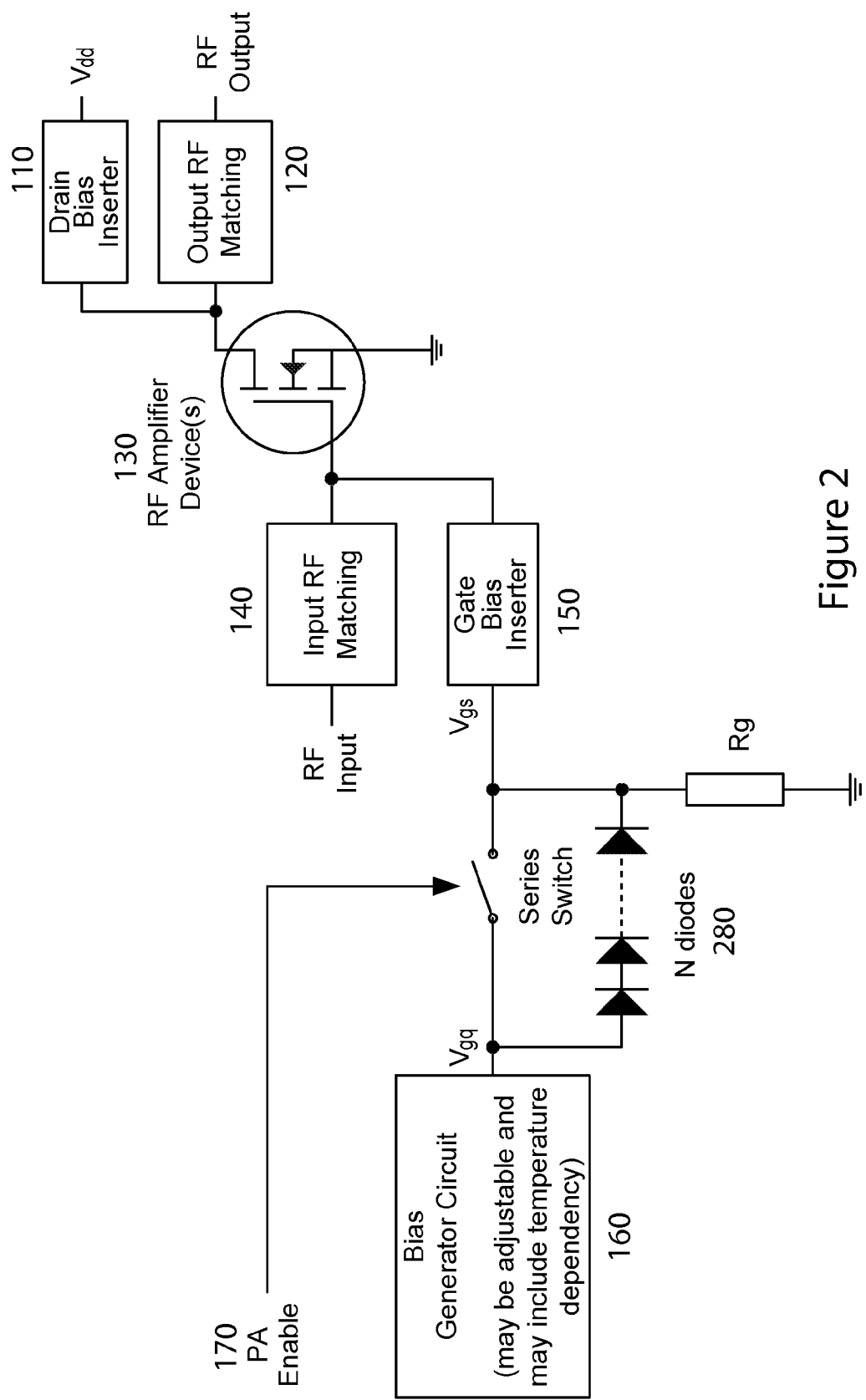
FIG. 2 illustrates an apparatus according to certain embodiments, including a diode level shifter.
Figure 3:
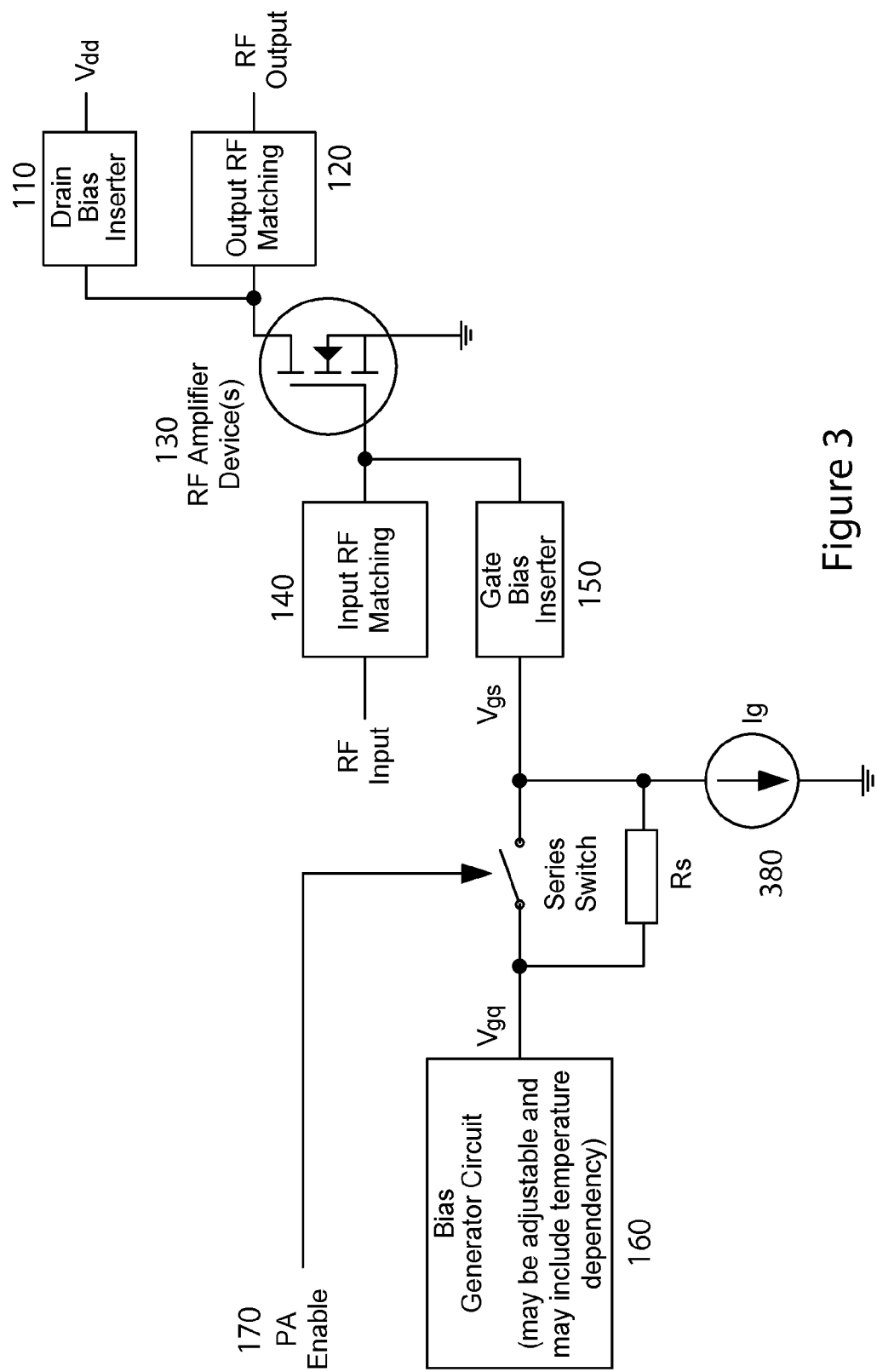
FIG. 3 illustrates an apparatus according to certain embodiments, including a current source level shift.
Figure 4:
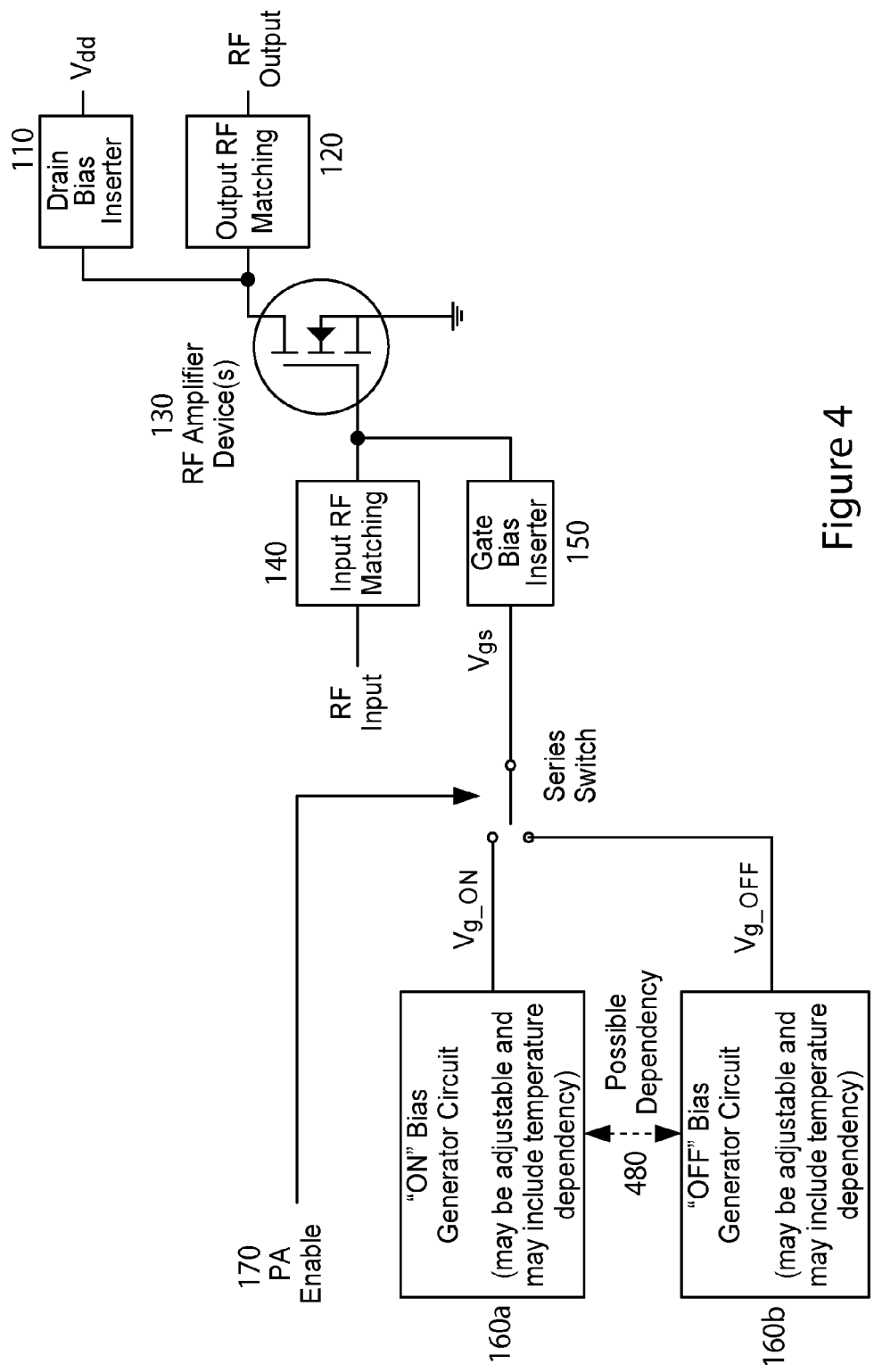
FIG. 4 illustrates an apparatus according to certain embodiments, including quasi-independent sources.

FIGS. 1-4 have a number of common features including drain bias inserter 110, output RF matching element 120, RF Amplifier Device(s) 130, and input RF matching element 140. The drain bias inserter 110 can supply voltage Vdd to the RF Amplifier Device(s) 130, while output RF matching element 120 can provide an RF output for the RF Amplifier Device(s) 130. The input RF matching element 140 can provide RF input to the RF Amplifier Device(s) 130. Likewise, a gate bias inserter 150 can supply gate bias voltage Vgs to the RF Amplifier Device(s) 130, which can be based on Bias Generator Circuit 160's voltage Vgq. In FIG. 4, instead bias voltage can be supplied by "On" bias generator circuit 160a and "off" bias generator circuit 160b. PA Enable 170 can provide a control input to the system, and can be based on information such as whether transmission is scheduled in a timeslot.

FIG. 1 illustrates a resistor bridging the series switch as a resistive voltage divider 180. This resistor can create a relatively constant differential suitable for numerous applications. The differential error factor can be expressed as follows:

$$dV\_error = \frac{Rs}{Rs + Rg} \quad \text{(Equation 1)}$$

In an example LDMOS device, in which the desired quiescent gate voltage is 3.2 volts and the desired differential to the off state is 0.6 v lower, equation 1 would result in Rs=(3/13)*Rg and an error factor of 19%. Assuming a threshold voltage shift across process of +/−0.5 v, for example, the voltage differential would fall in the range of 0.5~0.7 v, which may be acceptable.

For more demanding applications, where the differential must be more tightly controlled, alternate implementations can be used. For example, as illustrated in FIG. 2, a series of diodes can be used in a diode level shifter 280.

The arrangement of FIG. 2 may be useful when it is desired to have a bias voltage that increases with temperature. This increasing voltage can happen because the diode forward drop can generally decrease with temperature, roughly −2.2 mV/C for Si junction diodes. Thus, the off state voltage can increase. Should a lesser change in voltage over temperature be desired, appropriate selection of a series resistor and a shunt resistor can reduce the temperature slope, as discussed in U.S. Pat. Nos. 7,095,282 and 7,034,618.

Alternatively, as shown in FIG. 3, use of a temperature compensated current source 380 can realize a stable voltage shift. In this case the voltage shift may simply be Rs*Ig.

An even more complex and generic case is illustrated in the arrangement shown in FIG. 4, which shows quasi-independent sources 160a and 160b. In this case two independent bias voltage generators 160a and 160b can be used, each having unique temperature characteristics. Additionally, a coupling signal(s) 480 between them can be used to include any behavior that is common.

Regardless of the chosen implementation, in order to minimize the RF device characteristic change whilst maximizing power savings, the off state voltage can be maintained close to the threshold voltage. If kept above the threshold, some potential power savings may be lost, but the RF transistor characteristic change can be reduced. If kept below the threshold voltage, maximum power saving may be achieved but the RF transistor characteristic change can be larger. Thus, a desired balance between characteristic change and power savings can be readily achieved.

Certain embodiments may be characterized by the gate or base bias voltage. Certain embodiments may produce the result that the off state voltage correlates reasonably closely to the threshold voltage for the RF device.

Figure 5:
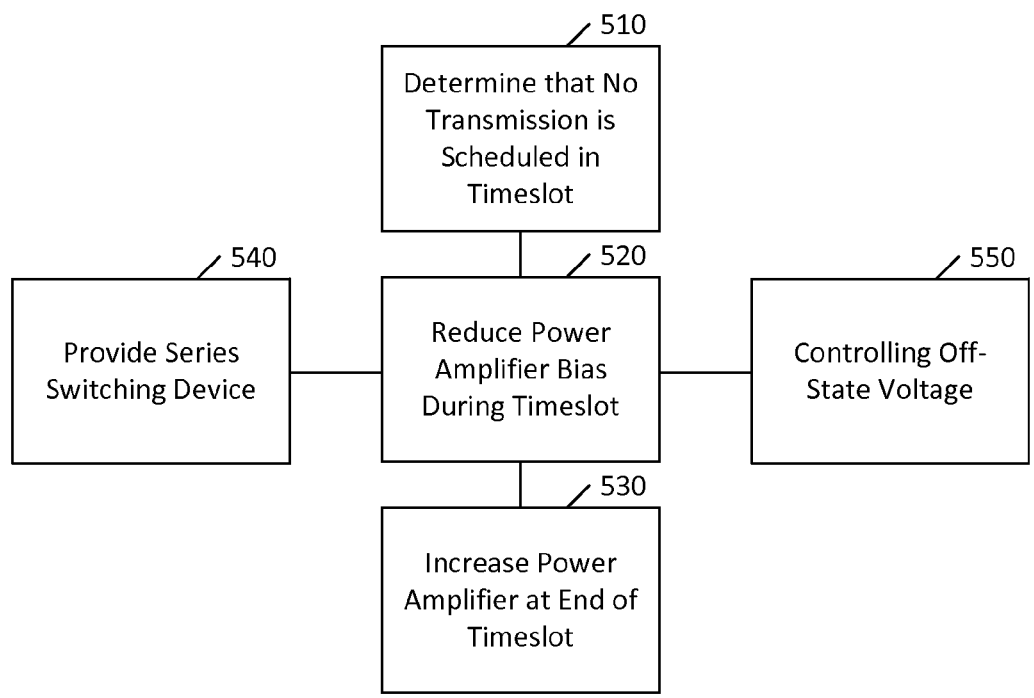
FIG. 5 illustrates a method according to certain embodiments.

FIG. 5 illustrates a method according to certain embodiments. As shown in FIG. 5, a method can include, at 510, determining that there is no transmission scheduled during a timeslot. The method can also include, at 520, reducing a power amplifier bias during the inactive timeslot. This reduction can be a reduction from a nominal level used during active timeslots. The method can further include, at 530, increasing the power amplifier bias at the end of the inactive timeslot, this increasing can be, for example, restoring the power amplifier bias to nominal. Nominal here can refer to the bias level used for active transmission. This increase can begin near the end of the inactive timeslot, for example, timed so that the increase is complete at the start of the next active timeslot. The reducing the power amplifier bias can include reducing the power amplifier bias to a threshold of a transistor of the power amplifier. The period during which power is lower, but at least a threshold amount, may be as short as a single time slot but may also span multiple time slots, depending on traffic. Thus timeslot here is just one example of time intervals or time periods, which may actually be more than one consecutive timeslot.

How the power amplifier bias is controlled may vary in different embodiments. For example, in the case of a field effect transistor (FET), the gate voltage can be controlled. By contrast, in the case of a bipolar junction transistor (BJT), the circuit of certain embodiments can control the current.

The threshold can be a predetermined fixed threshold. Alternatively, the threshold can be a temperature dependent dynamic threshold, a process dependent dynamic threshold, or both.

The method can further include, at 540, providing a series switching device between a bias source and the transistor. The power amplifier bias can be controlled by use of the series switching device. The method can additionally include, at 550, controlling an off-state voltage of the power amplifier bias based on a nominal bias condition. The controlling can track threshold variations of the transistor over temperature.

The above methods can be used in combination with other techniques for stabilizing the characteristics of the power amplifier. For example, the timing of when the bias voltage can be adjusted based on anticipation of need in combination with using the approach illustrated in FIG. 5 and elsewhere herein.

The above method can be implemented in various ways. For example, the method can be implemented entirely in hardware or in software running on hardware. The software may be a non-transitory computer-readable medium encoded with instructions that, when executed in hardware, perform a process. The process can be any of the methods described herein.

Figure 6:
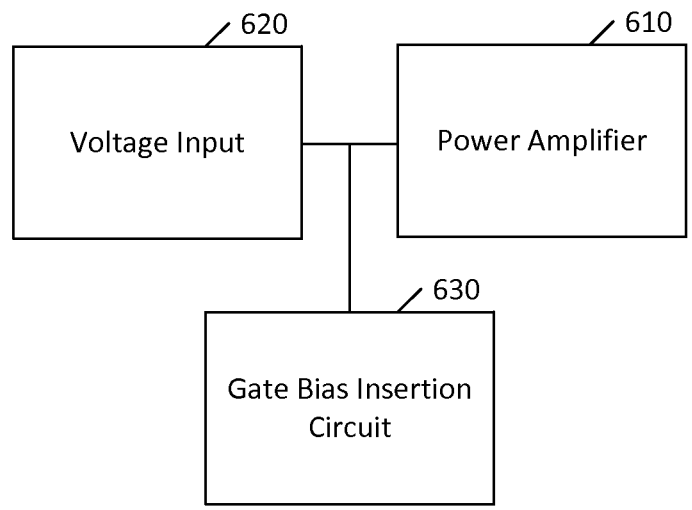
FIG. 6 illustrates a system according to certain embodiments.

FIG. 6 illustrates a system according to certain embodiments. As shown in FIG. 6, a system can include a power amplifier device 610. The system can also include a voltage input 620 to the power amplifier device 610. An input voltage to the voltage input 620 is configured to be controlled according to scheduled transmission in a slot. A gate bias insertion circuit 630 can provided at the voltage input 620. The gate bias insertion circuit 630 can be configured to provide a reduced input voltage as a power amplifier bias. The reduced input voltage can be configured to correspond to a threshold of a transistor of the power amplifier 610 when transmission is not scheduled in a slot.

The gate bias insertion circuit can include a series switching device between a bias source and the transistor, wherein the power amplifier bias is configured to be controlled by use of the series switching device. This approach can be seen, for example, in FIGS. 1-4.

The series switching device can be provided with a resistive divider configured to divide a voltage across the series switching device, as shown in FIG. 1. Alternatively or in addition the series switching device can be provided with a diode level shifter configured to divide a voltage across the series switching device, as illustrated in FIG. 2. Alternatively, or in addition, the series switching device can be provided with a current source level shift configured to divide a voltage across the series switching device, as illustrated in FIG. 3. Alternatively or in addition, the series switching device can be provided with quasi-independent sources, wherein the series switching device is configured to select between the quasi-independent sources, as illustrated in FIG. 4. As mentioned above, the transistors may be voltage controlled, for example FETs, or current controlled, for example BJTs. The sources can, therefore, be either voltage sources or current sources, depending on, for example, the transistor.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

GLOSSARY

RFM Radio Frequency Module or radio transceiver unit
TX Transmitter
PA Power Amplifier
LPA Linear Power Amplifier
LDMOS Laterally Diffused Metal Oxide Semiconductor field effect transistor
MOSFET Metal Oxide Semiconductor Field Effect Transistor
BJT Bipolar Junction Transistor
HBT Hetero junction Bipolar Transistor
MESFET MEtal Semiconductor Field Effect Transistor
TDMA Time Division Multiple Access
WCDMA Wideband Code Division Multiple Access
LTE Long Term Evolution
GSM Global System for Mobile communication
RF Radio Frequency
FET Field Effect Transistor

I claim:

1. A method, comprising:
    determining that there is no transmission scheduled during a time period;
    reducing a power amplifier bias during the inactive time period; and
    restoring the power amplifier bias to nominal at the end of the inactive time period,
    wherein the reducing the power amplifier bias comprises reducing the power amplifier bias to a threshold of a transistor of the power amplifier.

2. The method of claim 1, wherein the threshold is a predetermined fixed threshold.

3. The method of claim 1, wherein the threshold is a temperature dependent dynamic threshold.

4. The method of claim 1, wherein the threshold is a process dependent dynamic threshold.

5. The method of claim 1, further comprising:
    providing a series switching device between a bias source and the transistor,
    wherein the power amplifier bias is controlled by use of the series switching device.

6. The method of claim 1, further comprising:
    controlling an off-state voltage of the power amplifier bias based on a nominal bias condition.

7. The method of claim 6, wherein the controlling tracks threshold variations of the transistor over temperature.

8. An apparatus, comprising:
    a power amplifier device;
    a voltage or current input to the power amplifier device, wherein an input voltage or current to the voltage or current input is configured to be controlled according to scheduled transmission in a slot;
    a gate bias insertion circuit provided at the voltage or current input, wherein the gate bias insertion circuit is configured to provide a reduced input voltage or current as a power amplifier bias, wherein the reduced input voltage or current is configured to correspond to a threshold of a transistor of the power amplifier when transmission is not scheduled in a slot.

9. The apparatus of claim 8, wherein the gate bias insertion circuit comprises a series switching device between a bias source and the transistor, wherein the power amplifier bias is configured to be controlled by use of the series switching device.

10. The apparatus of claim 9, wherein the series switching device is provided with a resistive divider configured to divide a voltage across the series switching device.

11. The apparatus of claim 9, wherein the series switching device is provided with a diode level shifter configured to divide a voltage across the series switching device.

12. The apparatus of claim 9, wherein the series switching device is provided with a current source level shift configured to divide a voltage across the series switching device.

13. The apparatus of claim 9, wherein the series switching device is provided with quasi-independent sources, wherein the series switching device is configured to select between the quasi-independent sources.

14. An apparatus, comprising:
    determining means for determining that there is no transmission scheduled during a time period;
    reducing means for reducing a power amplifier bias during the inactive time period; and
    restoring means for restoring the power amplifier bias to nominal at the end of the inactive time period,
    wherein the reducing the power amplifier bias comprises reducing the power amplifier bias to a threshold of a transistor of the power amplifier.

15. The apparatus of claim 14, wherein the threshold is a predetermined fixed threshold.

16. The apparatus of claim 14, wherein the threshold is a temperature dependent dynamic threshold.

17. The apparatus of claim 14, wherein the threshold is a process dependent dynamic threshold.

18. The apparatus of claim 14, further comprising:
    series switching means for controlling the power amplifier bias,
    wherein the series switching means is provided between a bias source and the transistor.

19. The apparatus of claim 14, further comprising:
    controlling means for controlling an off-state voltage of the power amplifier bias based on a nominal bias condition.

20. The apparatus of claim 19, wherein the controlling means is further for tracking threshold variations of the transistor over temperature.

* * * * *